United States Patent
Duggan

(10) Patent No.: US 6,695,913 B1
(45) Date of Patent: Feb. 24, 2004

(54) III-NITRIDE OPTOELECTRONIC SEMICONDUCTOR DEVICE CONTAINING LATTICE MISMATCHED III-NITRIDE SEMICONDUCTOR MATERIALS

(75) Inventor: Geoffrey Duggan, Deddington (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/500,164

(22) Filed: Feb. 8, 2000

Related U.S. Application Data

(62) Division of application No. 09/111,975, filed on Jul. 8, 1998, now Pat. No. 6,072,189.

(30) Foreign Application Priority Data

Jul. 10, 1997 (GB) .............................................. 9714468

(51) Int. Cl.⁷ ............................................. C30B 25/10
(52) U.S. Cl. ........................... 117/94; 117/90; 117/104; 117/952
(58) Field of Search ............................. 117/94, 104, 90, 117/952

(56) References Cited

U.S. PATENT DOCUMENTS

| | | | |
|---|---|---|---|
| 5,003,548 A | 3/1991 | Bour et al. ..................... 372/44 |
| 5,476,811 A | 12/1995 | Fujii et al. .................. 432/105 |
| 5,592,501 A | 1/1997 | Edmond et al. .............. 372/45 |
| 5,646,953 A | 7/1997 | Naito et al. ................... 372/46 |
| 5,670,798 A | * 9/1997 | Schetzina .................... 257/96 |
| 5,838,706 A | * 11/1998 | Edmond et al. .............. 372/45 |
| 6,072,189 A | * 6/2000 | Duggan ........................ 257/14 |
| 6,278,720 B1 | * 8/2001 | Lee et al. ..................... 372/46 |
| 6,309,459 B1 | * 10/2001 | Yuge ........................... 117/105 |

FOREIGN PATENT DOCUMENTS

| | | |
|---|---|---|
| EP | 731512 | 9/1996 |
| JP | 09018083 | 1/1997 |
| WO | 9642114 | 12/1996 |

OTHER PUBLICATIONS

European Search Report dated Sep. 23, 1999 for Application No. 98305437.

(List continued on next page.)

*Primary Examiner*—Robert Kunemund
(74) *Attorney, Agent, or Firm*—Renner, Otto, Boisselle & Sklar, LLP

(57) ABSTRACT

A light-emitting diode or laser diode comprises a sapphire substrate and, grown on the substrate, a GaN buffer layer, an n-doped GaN contact layer, an n-doped (AlGa)N cladding layer, a Zn-doped (InGa)N active layer, a p-doped (AlGa)N cladding layer and a p-doped GaN contact layer. Graded layers are introduced at the interfaces between the cladding layers and both the contact layers and the active layer. The constituency of each graded layer is graded from one side to the other of the layer such that the layer is lattice matched with the adjacent layer on each side with the result that the strain at the interfaces between the layers is reduced and the possibility of deleterious dislocations being introduced at the interfaces is minimised. By removing or reducing such dislocations, the efficiency of the operation of the device is increased.

43 Claims, 8 Drawing Sheets

OTHER PUBLICATIONS

100h II–VI Blue–Green laser diode; S. Taniguchi, T. Hino, S. Itoh, K. Nakano, N. Nakayama, A. Ishibashi and M. Ileda., Mar. 14, 1996, vol. 32, No. 6.

Candela–class high–brightness in GaN/AlGaN double–heterostructure blue–light–emitting diodes, S. Nakamura, T. Mukai and M. Senoh, Jan. 5, 1994, American Institute of Physics, p. 1687–1689.

High–power InGaN single–quantum–well–structure blue and violet light–emitting diodes, S. Nakamura, M. Senoh, N. Iwasa and Shin–ichi Nagahama, Jul. 31, 1995, American Institute of Physics, p. 1868–1870.

InGaN–Based Multi–Quantum–Well–Structure Laser Diodes, S. Nakamura, M. Senoh, Shin–ichi Nagahama, N. Iwasa, T. Yamada, T. Matsushita, H. Kiyoku and Y. Sugimoto, Jan. 15, 1996, p. 74–76.

Blue–violet light emitting gallium nitride p–n junctions grown by electron cyclotron Resonance–assisted molecular beam epitaxy, R.J. Molnar, R. Singh and T. D. Moustakas, Jan. 16, 1995, American Institute of Physics, p. 268–270.

Radiative recombination lifetime measurements of InGaN single quantum well, C–K Sun, S. Keller, G. Wang, M. S. Minisky, J. E. Bowers, and S. P. DenBaars, Apr. 24, 1996, American Institute of Physics, p. 1936–1938.

Toshiba Develops Blue–Purple Semiconductor Laser Technology, Sep. 11, 1996. Toshiba.

Growth and Doping of GaN Films by ECR–Assisted MBE, T.D. Moustakas and R.J. Molnar, 1993 Materials Research Society, vol. 281.

* cited by examiner

III-NITRIDE OPTOELECTRONIC SEMICONDUCTOR DEVICE CONTAINING LATTICE MISMATCHED III-NITRIDE SEMICONDUCTOR MATERIALS

This application is a divisional application of U.S. Ser. No. 09/111,975, filed Jul. 8, 1998, which is now U.S. Pat. No. 6,072,189, which issued Jun. 6, 2000.

FIELD OF THE INVENTION

This invention relates to III-Nitride optoelectronic semiconductor devices, such as light-emitting diodes and laser diodes, and methods of making such devices. It will be well understood by those skilled in the art that a III-Nitride optoelectronic semiconductor device comprises a Group III–V semiconductor compound in which the Group V element is Nitrogen or Nitride containing.

BACKGROUND OF THE INVENTION

Optical data storage technology is capable of storing data, such as audio or video information, at very high densities, and has many applications in both consumer and professional fields. As is well known, such optical data storage technology is used in the reading and writing of compact disks (CD), as well as in the reading and writing of the more recently developed digital video disks (DVD). The introduction of the DVD has resulted in an increase in data storage capacity of more than ten times as compared with the CD, this increase having been brought about by a combination of tighter system tolerances and a decrease in the laser wavelength used to read or write information on the disk, for example from 780 nm to about 650 nm. Further increases in data storage capacity are realisable if the laser wavelength is further reduced to the blue and ultraviolet (UV) parts of the spectrum.

There are two groups of semiconductor compounds and alloys which are capable of emitting light in the blue and UV parts of the spectrum. These are the Group II–VI semiconductor materials denoted generally as (Zn, Mg) (S, Se), where such notation indicates the different compounds formed by combining either Zinc (Zn) or Magnesium (Mg) with Sulphur (S) or Selenium (Se), and Group III–V semiconductor materials from the alloy system denoted by (Al, Ga, In)N, where such notation indicates the alloys formed by combining Aluminium (Al), Gallium (Ga) or Indium (In) with Nitrogen (N)). The former group is most suited to emission in the blue-green part of the spectrum, whilst alloys and compounds of the latter group are particularly suited to emission in a wavelength range spanning orange, through blue to UV.

Progress in the development of Group II–VI semiconductor materials for use in light-emitting devices has resulted in the announcement of 100 hours cw operation of a blue-green laser diode (LD) by S. Taniguchi et al, Electron. Letters, 32, 552 (1996). Whilst this is an impressive achievement, progress in the development of Group III–V semiconductor materials has been even more significant over the last few years. In 1994, the successful realisation of a (InGa)N/(AlGa)N double heterostructure, high brightness blue light-emitting diode was reported by S. Nakamura et al, Appl. Phys. Lett., 64, 1687 (1994). This was followed in 1995 by an announcement of the successful realisation of high brightness blue and violet light-emitting diodes by S. Nakamura et al, Appl. Phys. Lett., 67, 1868 (1995), based on the use of (InGa)N quantum wells (QW) in the active region of the diode. In 1996, pulsed operation at room temperature of an (InGa)N QW laser diode was reported by S. Nakamura et al, Jpn. J. Appl. Phys., 35, L74 (1996). Recently the pulsed operation of an (InGa)N QW laser diode has been announced in Toshiba Corporation, Press Release, Sep. 11, 1996, and the cw operation at room temperature of a 412 nm (InGa)N MQW laser diode has been announced by S. Nakamura et al, late news paper at the IEEE-LEOS Annual Meeting, Boston, November 1996.

These reported results have led to considerable interest being shown in the growth of III-Nitride semiconductor materials and the fabrication of light-emitting diodes and laser diodes based on such materials. Such materials have mainly been produced by the method of epitaxial growth known as Metal Organic Chemical Vapour Deposition (MOCVD) which is also known as Metal Organic Vapour Phase Epitaxy (MOVPE). However it should be noted that such materials can also be produced by the epitaxial growth method known as Molecular Beam Epitaxy (MBE) as reported by, for example, R. J. Molnar et al, Appl. Phys. Lett., 66, 268 (1995). This approach has resulted in the achievement of p-type doping and weak electroluminescence (EL) at room temperature from both GaN homojunction light-emitting diodes and (InGa)N/GaN heterojunction light-emitting diodes. Whilst the results obtained from the semiconductor materials produced by the MBE growth method are currently inferior to the results obtained from semiconductor materials produced by the MOCVD growth method, there are potential advantages in producing such semiconductor materials using the MBE growth method due to the fact that the temperature difference between the growth temperatures of (InGa)N and GaN (or (AlGa)N) is smaller when the MBE growth method is used than when the MOCVD growth method is used, as will be described in more detail below.

A significant problem in the epitaxial growth of III-Nitride semiconductor materials is the hetero-epitaxial nature of the growth process. GaN semiconductor material is only available in non-commercially viable pieces of a few millimeters in dimension so that most growth of GaN is carried out on a Sapphire substrate. Alternative substrate materials have been tried, such as Silicon Carbide (SiC), various oxides such as Lithium Gallate, and Spinel. Without exception, GaN is lattice mismatched from these substrates. For example, the lattice constant of Sapphire is approximately 12.5% larger than that of GaN, and this leads to the generation of many defects at the interface between the GaN and Sapphire. However it appears that GaN is much more fault tolerant than other Group III–V semiconductor materials, and GaN-based light-emitting diodes can operate successfully for extended periods even where there are approximately $10^{10}$ cm$^{-2}$ defects in the material. Additionally the differential thermal expansion between the epilayer and the substrate can lead to the generation of dislocations in the layers of the device if the strain energy is not accommodated elastically.

Until commercially viable GaN substrates become available, such problems of hetero-epitaxy and the resulting dislocations that it introduces seem unavoidable. Meanwhile one empirical solution is to grow a sufficiently thick layer of GaN (on a suitable buffer layer) until the layer becomes fully relaxed. Further layers can then be deposited epitaxially onto the layer with the GaN lattice constant. It is also likely that many of the dislocations that are introduced at the substrate-buffer interface will have turned over, and will not therefore penetrate through the whole of the GaN layer if it is sufficiently thick.

A further problem in the growth of III-Nitride semiconductor materials is a function of the design of the light-emitting diode structure used. FIG. 1 diagrammatically illustrates the light-emitting diode structure used by S. Nakamura et al, Appl. Phys. Lett., 64, 1687 (1994) as reported above. This structure was produced using a MOCVD growth method. A GaN buffer layer 2 of a thickness of about 300 Å was grown on a Sapphire substrate 1 at about 510° C., followed by a n-doped GaN contact layer 3 of a thickness of about 4 $\mu$m, a n-doped (AlGa)N cladding layer 4 of a thickness of about 1.5 $\mu$m, and a Zn-doped (InGa)N active layer 5 of a thickness of about 500 Å. After growth of the active layer 5, p-doped cladding and contact layers 6 and 7 of (AlGa)N and GaN were grown to thicknesses of about 0.15 $\mu$m and 0.5 $\mu$m respectively, and finally a n-type electrode 8 and p-type electrode 9 were evaporated onto the n-doped contact layer 3 and the p-doped contact layer 7.

Furthermore FIG. 2 shows a graph of the variation of the lattice constant a against the band gap energy for the quaternary system (Al, Ga, In) N. In the light-emitting diode structure of FIG. 1, the In mole fraction in the active layer 5 of the device is approximately 0.06 whilst the Al mole fraction in the surrounding cladding layers 4 and 6 is approximately 0.15. It will be appreciated from FIG. 2 that none of the (AlGa)N cladding layers 4 and 6 and the (InGa)N active layer 5 are latticed matched with GaN or each other, the strain being approximately ±1% relative to GaN. If some of the resulting strain is not accommodated elastically, then the energy is released in the form of dislocations in the active region of the light-emitting diode or laser diode. Such dislocations would clearly have a deleterious effect upon the efficiency of operation of the device.

A further complication results from the need to grow the (InGa)N active layer 5 at a substrate temperature which is approximately 200–300° C. lower than the temperature used to grow either the GaN contact layer 7 or the (AlGa)N cladding layer 6, that is at a temperature of 700–800° C. as compared with a temperature of 1020° C. for growth of the layers 6 and 7, due to the re-evaporation of Indium from the growing surface at elevated temperatures. This re-evaporation effect can be significant as shown by C.-K. Sun et al, Appl. Phys. Lett., 69, 1936 (1996) where a graded (InGa)N layer was produced by ramping the growth temperature from 760° C. to 700° C. during evaporation of the Indium. The resulting variation in the Indium mole fraction across the layer as a function of the distance from the interface is shown in the graph of FIG. 3.

U.S. Pat. No. 5,476,811 discloses a method of manufacturing a laser diode having a GRIN-SCH structure and comprising a GaAs active layer sandwiched between two graded layers of composition $Al_xGa_{1-x}As$ where the Al constituency is varied across the layer in accordance with an accurately controlled compositional profile. The AlGaAs graded layers are produced by metal-organic molecular beam epitaxy while changing the temperature of the substrate so that the compositional parameter x is decreased during growth of a first graded layer prior to growth of the active layer, and the parameter x is increased during growth of the second graded layer on the active layer. Such epitaxial growth of graded layers of defined thickness using a defined crystal orientation serves to form optical confinement layers between the GaAs active region and the AlGaAs cladding regions providing an energy band structure confining the carriers to the active region. However such devices do not suffer from deleterious effects due to dislocations caused by lattice mismatching between the active layer and the cladding layers. Furthermore the graded layers disclosed in U.S. Pat. No. 5,476,811 would not be suitable for use in compensating for lattice mismatching in a GaN heterostructure in view of their constituency and thickness which are specifically adapted to their intended function as confinement layers.

SUMMARY OF THE INVENTION

It is an object of the invention to provide a method of producing III-nitride optoelectronic semiconductor device, such as a light-emitting semiconductor device, which enables the results of lattice mismatching and the resulting deleterious dislocations to be reduced.

According to the present invention, there is provided A III-Nitride optoelectronic semiconductor device having an active region of a III-Nitride semiconductor material which is lattice mismatched with a further III-Nitride semiconductor material of one or more cladding regions, the device comprising a substrate and, formed sequentially on the substrate, a first contact region of one doping type, a first cladding region of said one doping type, an active region, a second cladding region of the opposite doping type, and a second contact region of said opposite doping type, wherein, in order to compensate for the lattice mismatching between the active region and one or both of the cladding regions, a graded layer is interposed between the active region and one or both of the cladding regions which is such that one side of the graded layer is lattice matched with the adjacent active region and the other side of the graded layer is lattice matched with the adjacent cladding region and the graded layer has a constituency, for example a Group III constituency, which is graded from said one side to said other side of the graded layer.

The effect of the graded layer is to reduce the strain at the interface between the regions separated by the layer which suffer from significant lattice mismatching, and to thereby minimise the possibility of deleterious dislocations being introduced at the interface which could then propagate through the active region of the device. By removing or reducing such dislocations, the efficiency of operation of the device is increased. However it is not necessary for the device to be symmetric about the active region, and the cladding regions in particular may be of different compositions and/or thicknesses. Where graded layers are provided on both sides of the active region, these may also be of different compositions and/or thicknesses.

Preferably the graded layer between the active region and one or both of the cladding regions has a first constituent which is graded across the layer in one direction and a second constituent which is graded across the layer in the opposite direction. Furthermore the thickness of the or each graded layer is preferably in the range of 20 to 400 Å, most preferably in the range of 30 to 300 Å.

Preferably one or both of the cladding regions comprises a III-Nitride semiconductor material which is lattice mismatched with a III-Nitride semiconductor material of the adjacent contact region, and a further graded layer is interposed between one or both of the cladding regions and the adjacent contact region such that one side of the further graded layer is lattice matched with the adjacent cladding region and the other side of the further graded layer is lattice matched with the adjacent contact region and the further graded layer has a constituency, for example a Group III constituency, which is graded from said one side to said other side of the further graded layer.

In one embodiment the active region comprises a quantum well or multiquantum well disposed between two guide regions, and an additional graded layer is interposed between one or both of the guide regions and the well. This embodiment is applicable to a laser diode.

Each of the contact regions, the cladding regions and the active region preferably incorporate gallium as a constituent, and most preferably the active region incorporates indium whereas the cladding regions incorporate aluminium.

The invention also provides a method of growing a III-Nitride optoelectronic semiconductor device having an active region of a III-Nitride semiconductor material which is lattice mismatched with a further III-Nitride semiconductor material of one or more cladding regions, the device comprising a substrate and, formed sequentially on the substrate, a first contact region of one doping type, a first cladding region of said one doping type, an active region, a second cladding region of the opposite doping type, and a second contact region of said opposite doping type, the method comprising the steps of successively growing the first contact region, the first cladding region, the active region, the second cladding region and the second contact region on the substrate, and, between the growth of the active region and the growth of one or both of the cladding regions, growing a graded layer which is such that one side of the graded layer is lattice matched with the adjacent active region and the other side of the graded layer is lattice matched with the adjacent cladding region and the graded layer has a constituency which is graded from said one side to said other side of the graded layer, in order to compensate for the lattice mismatching between the active region and one or both of the cladding regions.

The active region may be grown at a first temperature while supplying a first constituent to the substrate surface, one or both of the cladding regions may be grown at a second temperature while supplying a second constituent to the substrate surface, and the graded layer may be grown by supplying at least one of the first and second constituents to the substrate surface while the substrate temperature is changed between the first and second temperatures. In one embodiment the second temperature is greater than the first temperature, and the graded layer is grown, after the growth of the first cladding region and before the growth of the active region, by supplying at least one of the first and second constituents to the substrate surface while the substrate temperature is ramped downward. In another embodiment the second temperature is greater than the first temperature, and the graded layer is grown, after the growth of the active region and before the growth of the second cladding region, by supplying at least one of the first and second constituents to the substrate surface while the substrate temperature is ramped upward.

Furthermore the first constituent may be supplied to the substrate surface during growth of the graded layer but with the supply of the second constituent to the substrate surface being stopped during such growth. Alternatively both the first constituent and the second constituent may be supplied to the substrate surface during growth of the graded layer. In this case the second constituent may be supplied to the substrate surface at a rate which is varied monotonically during growth of the graded layer between a maximum rate at which the second constituent is supplied during growth of the cladding region and a minimum rate.

In a further embodiment one or both of the cladding regions comprises a III-Nitride semiconductor material which is lattice mismatched with a III-Nitride semiconductor material of the adjacent contact region, and, between the growth of one or both of the cladding regions and the growth of the adjacent contact region, a further graded layer is grown such that one side of the further graded layer is lattice matched with the adjacent cladding region and the other side of the further graded layer is lattice matched with the adjacent contact region and the further graded layer has a constituency which is graded from said one side to said other side of the further graded layer. In this case one or both of the cladding regions is grown while supplying a constituent to the substrate surface, and the further graded layer is grown by supplying said constituent to the substrate surface at a rate which is varied monotonically between a maximum rate at which said constituent is supplied during growth of the cladding region and a minimum rate.

BRIEF DESCRIPTION OF THE DRAWINGS

Detailed Description of the Invention

Figure 1:
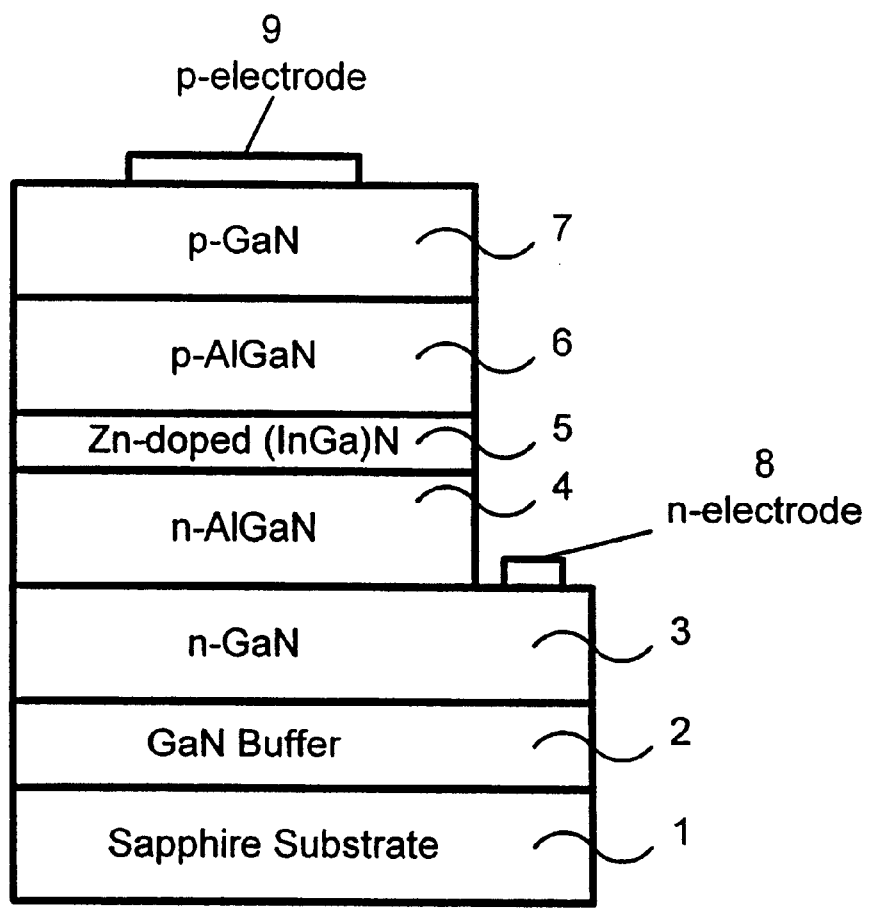
Figure 2:
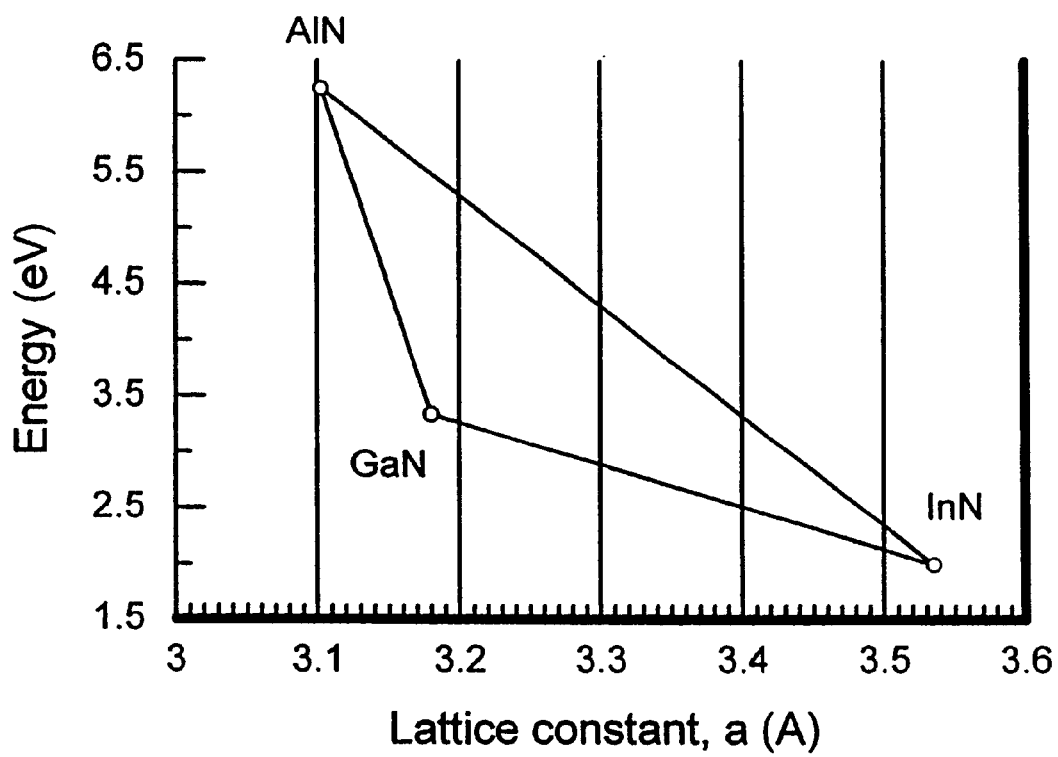
Figure 3:
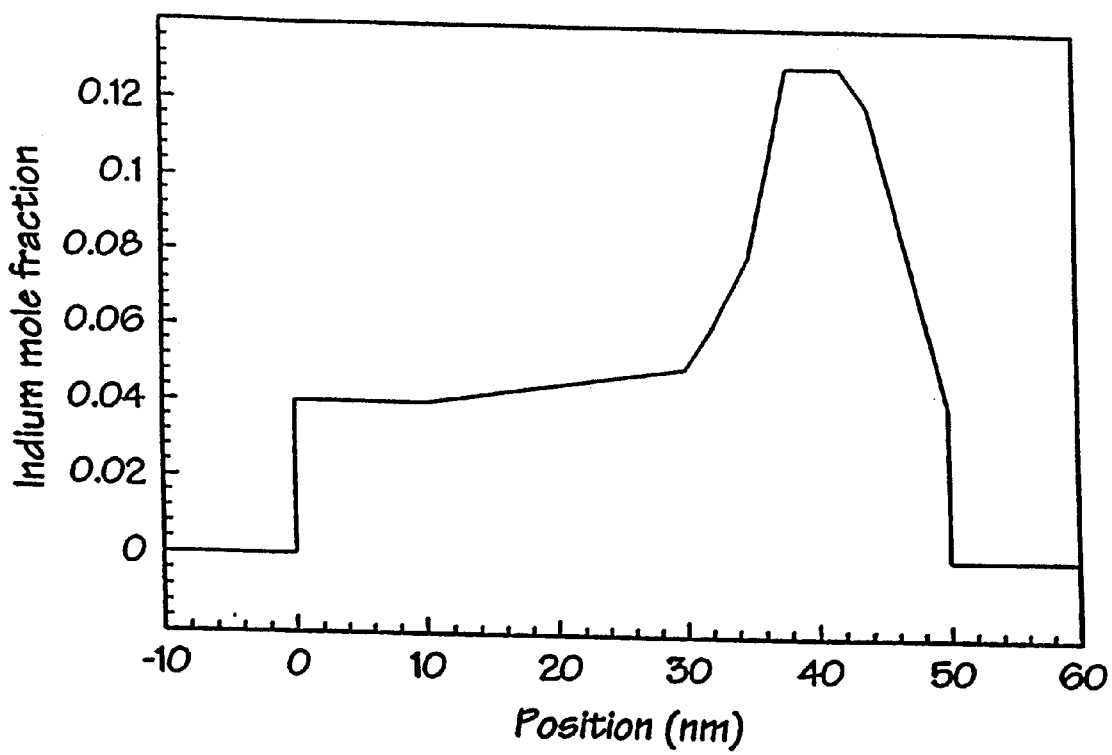
Figure 4:
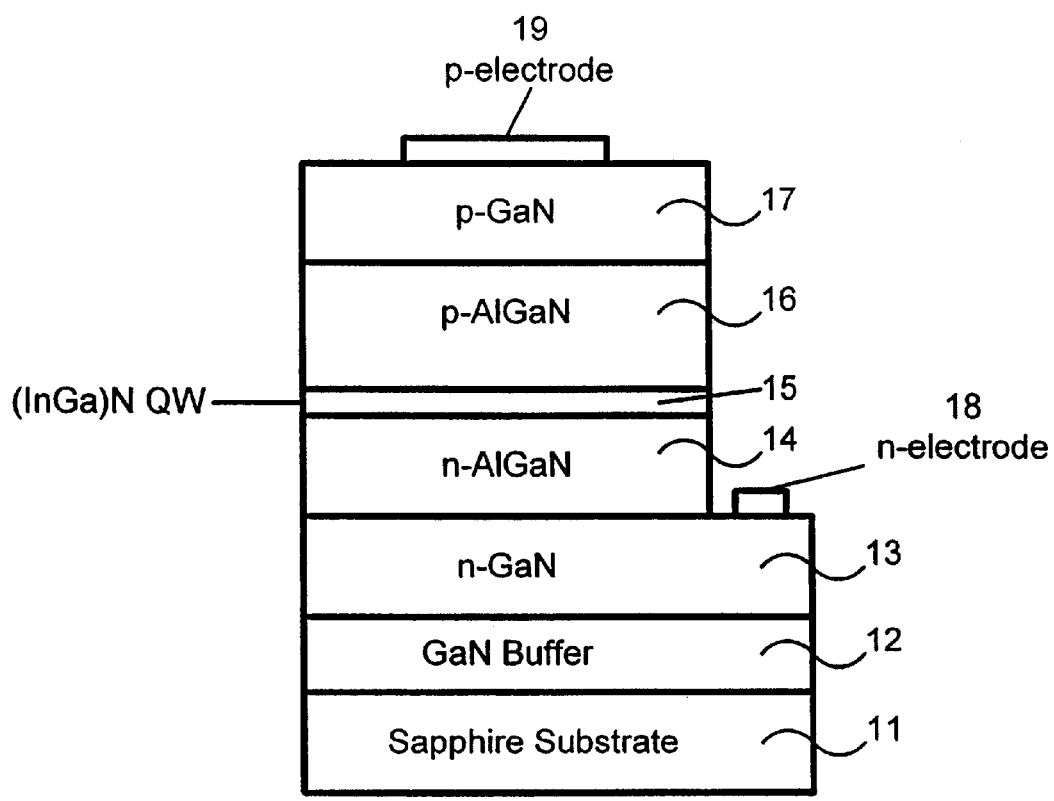
Figure 5:
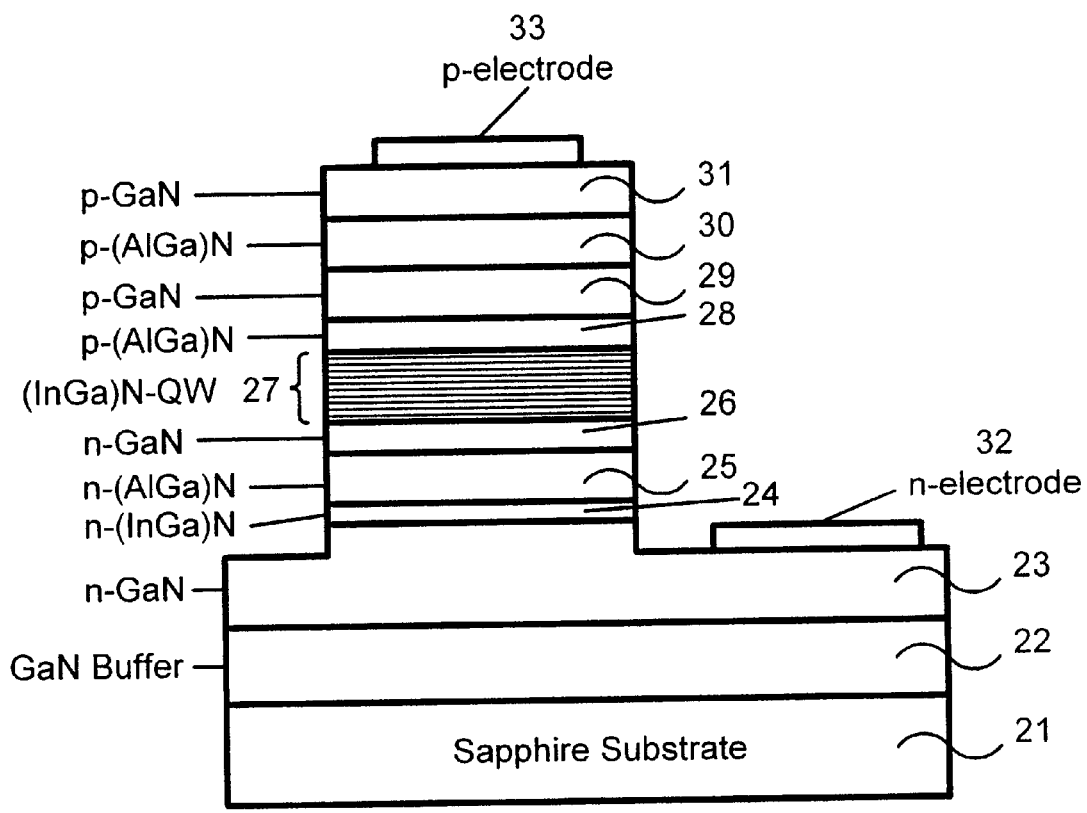
Figure 6:
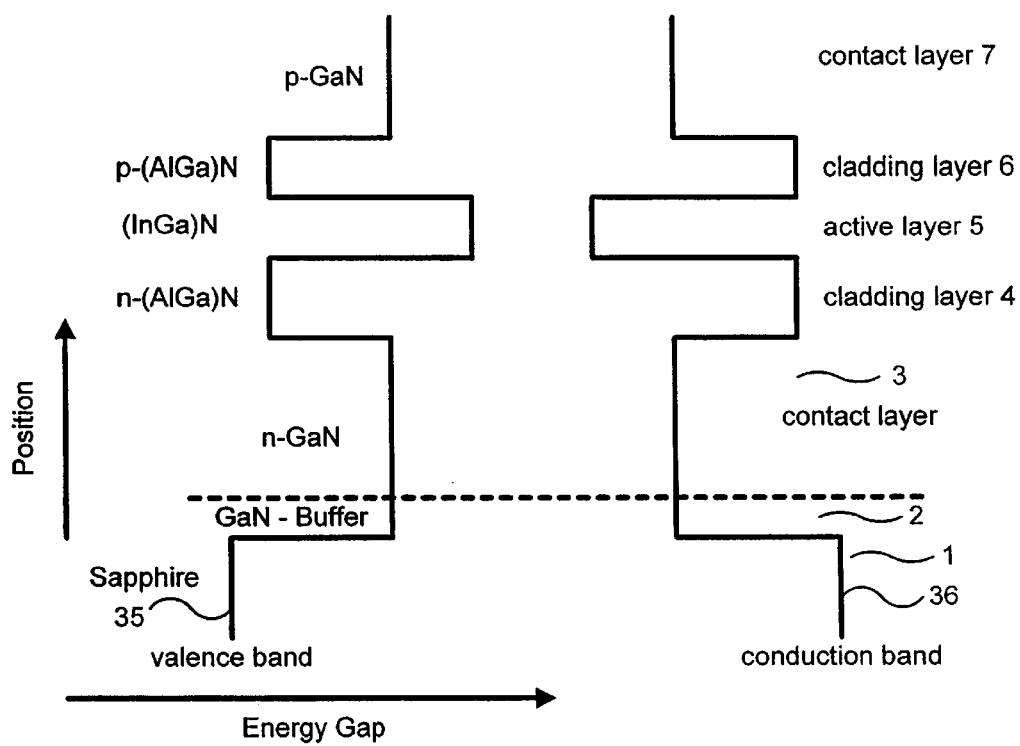
Figure 7:
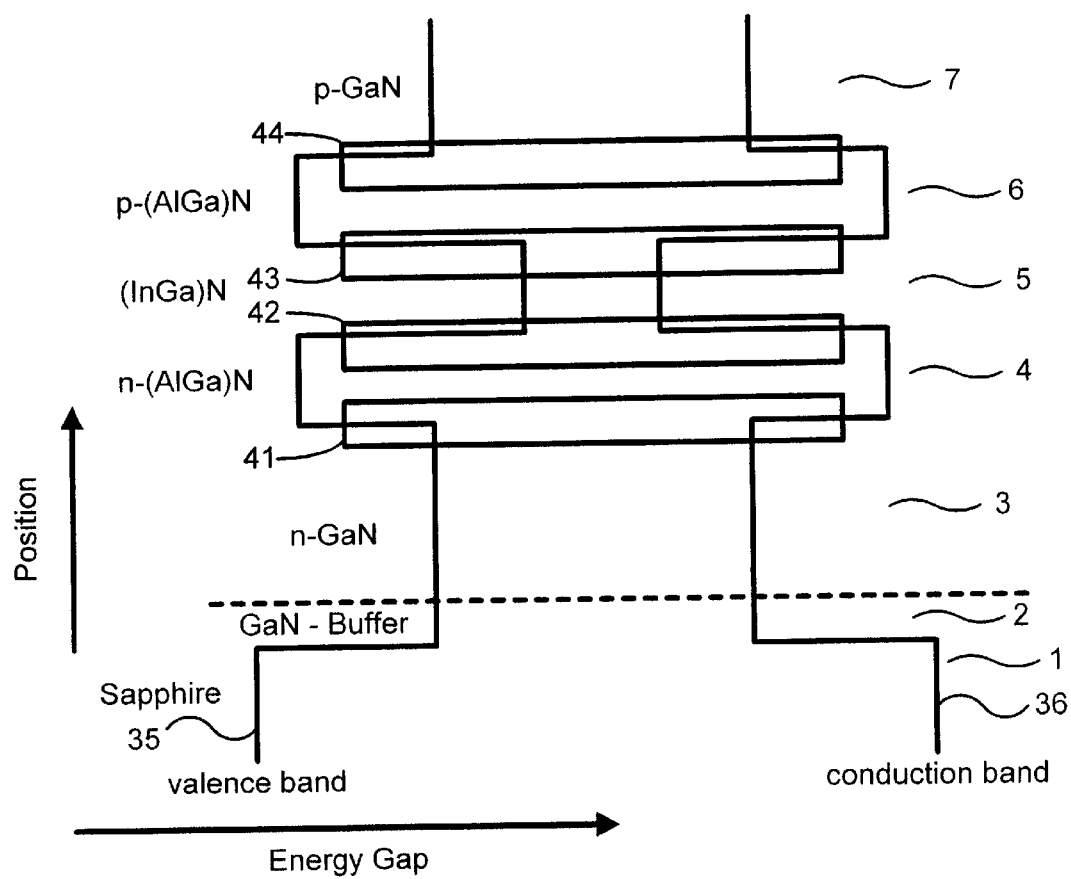
Figure 8:
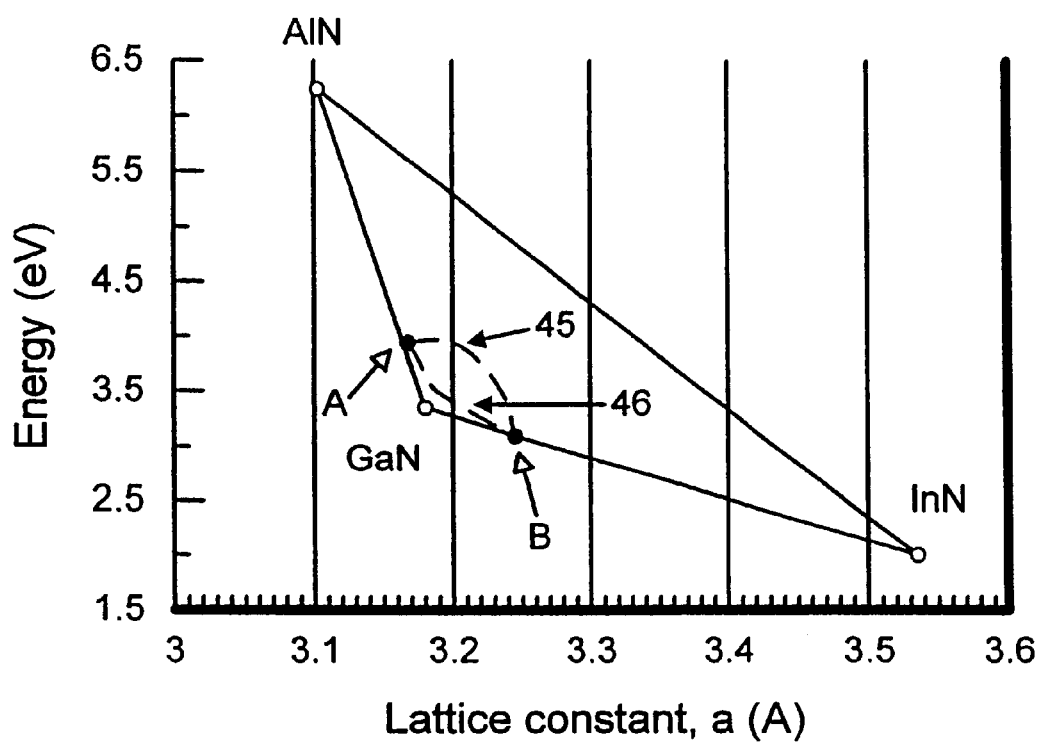

In order that the invention may be more fully understood, reference will now be made, by way of example, to the accompanying drawings, in which:

FIG. 1 is a schematic diagram of a known (InGa)N/(AlGa)N double heterostructure (DH) light-emitting diode structure;

FIG. 2 is a graph showing variation of the lattice constant with the band gap energy for the quaternary system (Al, Ga, In)N;

FIG. 3 is a graph showing variation of the Indium mole fraction introduced into a layer of (InGa)N whilst the temperature is ramped downward from 760° C. to 700° C.;

FIG. 4 is a schematic diagram of a known (InGa)N/(AlGa)N QW light-emitting diode structure;

FIG. 5 is a schematic diagram of a known (InGa)N MQW laser diode structure;

FIG. 6 is a schematic diagram showing the layer structure and energy gaps of the (InGa)N/(AlGa)N DH light-emitting diode structure of FIG. 1;

FIG. 7 is a schematic diagram showing the layer structure and energy gaps of a (InGa)N/(AlGa)N light-emitting diode structure in accordance with the invention; and FIG. 8 is a graph showing variation of the lattice constant with the band gap energy showing possible combinations of semiconductor materials which might be used for the cladding and active layers of a DH laser diode or light-emitting diode structure based on (Al, Ga, In)N semiconductor materials.

Mention has already been made, with reference to FIGS. 1 and 2, of the problems encountered in the MOCVD growth of (InGa)N/(AlGa)N DH structures. Similar problems would be encountered in the growth of such structures by molecular beam epitaxy (MBE). Indium re-evaporation from the growing surface is still likely to occur, even at a temperature in the range of 650–850° C. required for growth of the GaN layer in the MBE growth method.

In the production method of the invention the performance of light-emitting diodes and laser diodes based on such structures is improved by the introduction of a graded III-Nitride layer between the substantially lattice mismatched parts of the light-emitting diode or laser diode structure. The grading of the graded layer can be achieved in a variety of ways, for example by appropriately varying the fluxes of the Group III elements between the mismatched layers, or by varying the substrate temperature as the composition of the layers is altered abruptly, or by combining the effect of a varying substrate temperature with a varying Group III flux.

It should be understood that the description of a preferred embodiment of the invention given below with reference to a (Al, Ga, In)N DH light-emitting diode structure is given only by way of example as a simple device structure to which the invention is applicable, and that this is not the only structure which would benefit from the introduction of such a graded layer. It would be well understood by a person skilled in the art of device design and/or crystal growth that the invention is applicable to many other optoelectronic semiconductor devices, and to any growth method suitable for the growth of semiconductor materials for such devices. Furthermore it would be understood by a person skilled in the art that the substrate may be of a material other than Sapphire, such as Silicon Carbide, various oxides such as Lithium Gallate, and Spinel.

Other device structures to which the invention is applicable are shown diagrammatically in FIGS. 4 and 5. FIG. 4 shows a (InGa)N QW light-emitting diode structure comprising a Sapphire substrate 11 on which a GaN buffer layer 12 of a thickness of about 300 Å was grown at a low temperature of about 500° C. prior to growing of a n-doped GaN contact layer 13 of a thickness of about 4 $\mu$m at elevated temperature. A n-doped (AlGa)N cladding layer 14 of a thickness of about 500 Å was then grown at elevated temperature, followed by a quantum well (QW) structure 15 comprising a layer of undoped (InGa)N, a p-doped (AlGa)N cladding layer 16 of a thickness of about 1000 Å and a p-doped GaN contact layer 17 of a thickness of about 0.5 $\mu$m. Suitable n-type and p-type electrodes 18 and 19 were then evaporated onto the contact layers 13 and 17.

FIG. 5 shows the structure of a (InGa)N MQW laser diode structure to which the invention may also be applied. In this case a GaN buffer layer 22 and a n-doped GaN contact layer 23 were grown on a Sapphire substrate 21 as in the previous structure described, followed by a n-doped (InGa)N layer 24 of a thickness of about 0.1 $\mu$m, a n-doped (AlGa)N layer 25 of a thickness of about 0.4 $\mu$m and an n-doped GaN layer 26 of a thickness of about 0.1 $\mu$m. A multiquantum well (MQW) structure consisting of, say, 26 periods of alternating 25 Å thickness (InGa)N well layers and 50 Å thickness (InGa)N barrier layers was then grown, followed by a p-doped (AlGa)N layer 28 of a thickness of about 200 Å, a p-doped GaN layer 29 of a thickness of about 0.1 $\mu$m, a p-doped (AlGa)N layer 30 of a thickness of about 0.4 $\mu$m and a p-doped GaN contact layer 31 of a thickness of about 0.5 $\mu$m. The n-type and p-type electrodes 32 and 33 were then evaporated onto the contact layers 23 and 31.

FIG. 6 is a schematic diagram showing the variation in the energy gap of each constituent layer of the light-emitting diode structure of FIG. 1 as a function of the position of the layer in the structure. Like reference numerals are used to denote the same constituent layers as in FIG. 1. Furthermore the valence and conduction bands are denoted by the reference numerals 35 and 36 in the diagram. It will be appreciated from this diagram that each of the (AlGa)N cladding layers 4 and 6 is lattice mismatched with the GaN contact layers 3 and 7 and also with the (InGa)N active layer 5, and this can lead to the generation of dislocations in the active region of the device which will have a deleterious effect upon the efficiency of operation of the device.

FIG. 7 is a similar schematic diagram of a light-emitting diode structure in accordance with the invention having the same basic constituent layers as the structure of FIG. 1, but with the introduction of graded layers 41, 42, 43 and 44 at the interfaces between the (AlGa)N cladding layers 4 and 6 and both the GaN contact layers 3 and 7 and the (InGa)N active layer 5. Whilst graded layers 41, 42, 43 and 44 are shown at each of these four interfaces in the diagram of FIG. 7, it should be understood that it is also within the scope of the invention to provide graded layers 42 and 43 only at the interfaces between the (AlGa)N cladding layers 4 and 6 and the (InGa)N active layer 5, no such graded layers being provided in this case at the interfaces between the cladding layers 4 and 6 and the contact layers 3 and 7. It should be appreciated that the diagram of FIG. 7 is meant to indicate only the position of the graded layers 41, 42, 43 and 44 and not the position dependence of the energy gap through the graded region.

Each of the graded layers 41, 42, 43 and 44 of the structure of the invention may be produced by any of a range of fabrication steps, and the particular fabrication step used will depend on the particular structure of the optoelectronic semiconductor device to be produced and the required mode of operation, as well as other manufacturing considerations. In the basic fabrication steps for producing grading of the interfaces of such a structure, the following variables need to be considered:

(i) the way in which the Group III flux is altered at the interface, (ii) how the temperature of the substrate is altered at the interface, and (iii) whether the growth is interrupted when any of these adjustments is being made.

Point (ii) is of particular importance when considering the graded layers 42 and 43 at the interfaces between the cladding layers 4 and 6 and the active layer 5 where the constituents of the cladding layers 4 and 6 and the active layer 5 are ideally deposited at significantly different substrate temperatures, for example at about 1000° C. and 800° C. respectively.

Two possible methods of fabricating such graded layers in accordance with the invention will now be described. For the purposes of the description of these methods, reference will first be made, by way of example, to the heterojunction (HJ) between a cladding layer of constituency $Al_{0.1}Ga_{0.9}N$ and an active layer of constituency $In_{0.2}Ga_{0.8}N$, these materials having energy gaps and lattice constants shown by the points A and B respectively in the graph of FIG. 8. During the growth of the $Al_{0.1}Ga_{0.9}N$ cladding layer, the Al and Ga fluxes (in the case of a MBE growth method) or metal-organic flow rates (in the case of a MOCVD growth method) are arranged to be constant and set such that, under appropriate growth conditions, they will produce a ratio of Al:Ga molar content in the layer of about 1:9. The substrate temperature is set to an appropriate constant value, such as about 1000° C. for a MOCVD growth method or about 750° C. for a MBE growth method. However it should be understood that these temperature values are given only by way of example and do not represent the whole range of appropriate temperatures which may be usable to grow such a cladding layer. The heterojunction between the cladding layer and the active layer may be produced by stopping the flow of both Al and Ga and by reducing the substrate temperature by about 200–300° C. (in the case of a MOCVD growth method) or about 200° C. (in the case of a MBE growth method), and by restarting growth when the appropriate temperature has been reached by introducing In and Ga fluxes (in the case of a MBE growth method) or appropriate metal-organics (in the case of a MOCVD growth method) at a rate which is arranged to be constant and set such that, under appropriate growth conditions, they will produce a ratio of In:Ga molar content in the layer of about 1:4. This results in growth of the $In_{0.2}Ga_{0.8}N$ active layer on the lattice mismatched $Al_{0.1}Ga_{0.9}N$ cladding layer. The lattice mismatch between these layers is approximately 2% which means that only an active layer of about 50 Å thickness of the $In_{0.2}Ga_{0.8}N$ material can be accommodated elastically on the $Al_{0.1}Ga_{0.9}N$ cladding layer before dislocations are introduced. In a typical double heterostructure light-emitting diode (DH LED) the required active layer has a thickness significantly greater than 50 Å and thus non-radiative combination centres would be introduced by such a heterojunction in such a device and would harm the performance of the device.

However, in a first method according to the invention, a graded layer is produced at the interface between the $Al_{0.1}Ga_{0.9}N$ cladding layer and the $In_{0.2}Ga_{0.8}N$ active layer by modifying the basic method described above. The graded layer is produced by maintaining the flow of Al and Ga after downward ramping of the temperature has been initiated to reduce the temperature from the appropriate substrate temperature for growth of the cladding layer to the appropriate temperature for growth of the active layer, involving a reduction in temperature of about 200–300° C., and by initiating the In flow at the beginning of the downward ramping of the temperature. For example a temperature reduction of about 200° C. may be effected gradually over a time period of between 30 seconds and 5 minutes. At a growth rate of about 1 Å per second, this would produce a graded layer of a thickness of between about 30 Å and 300 Å. A thickness of about 30 Å may be suitable for a device such as that of FIG. 4 or 5, whereas a thickness of about 300 521 may be suitable for a device such as that of FIG. 1.

The flow of Al is continued until the appropriate temperature for growth of the active layer has been reached when the Al flow is abruptly switched off, and thereafter the flow of In and Ga is continued with the substrate temperature being maintained at a constant value as in the previously described method so as to effect growth of the $In_{0.2}Ga_{0.8}N$ active layer. Since the In incorporation rate is a function of substrate temperature (see FIG. 3) and since the temperature is ramped downward whilst the Al flow is continued and the In flow also takes place, the Al/In ratio changes with decreasing temperature and a graded layer is produced between the cladding layer and the active layer in which the Al/In ratio varies across the layer. Such a method produces a graded layer of a thickness of about 30–300 Å which may have an Al mole fraction which changes from 0.1 to zero across the layer, and an In mole fraction which changes from zero to 0.2 across the layer, as well as an energy gap and lattice constant profile of the form shown by the curve 45 in FIG. 8. The Al content would be expected to vary substantially linearly across the graded layer, although the In content would vary in a more unpredictable manner.

In an alternative method in accordance with the invention for producing a graded layer at the interface between the $Al_{0.1}Ga_{0.9}N$ cladding layer and the $In_{0.2}Ga_{0.8}N$ active layer, the Al and Ga flows are continued and the In flow is initiated when the temperature is ramped downward from the substrate temperature appropriate for growth of the cladding layer to the substrate temperature appropriate for growth of the active layer, but, instead of the Al flow being maintained at a constant level during the temperature reduction as in the first method described, the Al flow rate is decreased monotonically until it reaches a value of zero at the substrate temperature appropriate for the growth of the $In_{0.2}Ga_{0.8}N$ active layer. Such a method would provide a graded layer having an energy gap and lattice constant profile as shown by the curve 46 in FIG. 8.

Whichever of these two methods is used, a monotonically changing bandgap and lattice constant are provided at the interface between the cladding layer and the active layer, such as is shown by the graded layer 42 between the cladding layer 4 and the active layer 5 in FIG. 7. The graded layer 43 between the active layer 5 and the cladding layer 6 in FIG. 7 can be produced in similar manner but with the temperature gradient reversed so as to change from the lower temperature appropriate for growth of the active layer to the higher temperature appropriate for growth of the cladding layer whilst continuing the In and Ga flows so as to produce the required graded layer. In this case the Al flow may either be abruptly turned on when the higher temperature is reached to initiate growth of the cladding layer, or alternatively the Al flow may be turned on at the moment that upward ramping of the temperature is initiated. In both cases, it is not necessary to turn off the In flow since, at a certain temperature, no more In will be incorporated into the layer due to re-evaporation of In from the growing surface.

Where graded layers are produced at the interfaces between the cladding layers 4 and 6 and the contact layers 3 and 7, such as is shown by the graded layers 41 and 44 in FIG. 7, there is no need to alter the growth temperature between growth of the contact and cladding layers since these layers do not contain In. At these interfaces the graded layers can be produced simply by monotonically increasing the Al flux between the desired levels for growth of the contact layer 3 and the cladding layer 4 (in the case of the graded layer 41) or monotonically decreasing the Al flux between the desired levels for growth of the cladding layer 6 and the contact layer 7 (in the case of the graded layer 44).

Similar fabrication methods may be used in the production of a laser diode, although in this case, in order to provide the required optical feedback, the active layer will comprise a quantum well disposed between two guide regions which serve to guide the optical wave. Furthermore, if required, graded layers may be provided at the interfaces between each of the guide regions and the quantum well, in addition to the graded layers provided between the guide regions and the adjacent cladding layers.

Furthermore, in a modification of the described methods, the device may be formed on a GaN substrate with the cladding layers being formed from GaN so as to be lattice matched with the substrate, in which case the provision of a graded layer between substrate and the adjacent cladding layer would not be necessary. In this case, therefore, graded layers would be provided only between the cladding layers and the (InGa)N active layer.

What is claimed is:

1. A method of growing a III-nitride optoelectronic semiconductor device having an active region of a III-nitride semiconductor material including at least In which is lattice mismatched with a further III-nitride semiconductor material of one or more cladding regions, the device comprising a substrate and formed sequentially on the substrate; a first cladding region of a first doping type; an active region; a second cladding region of a second doping type opposite to the first doping type, the method comprising the steps of:

successively growing the first cladding region, the active region and the second cladding region on the substrate, and between the growth of the active region and the growth of one or both of the cladding regions, growing a graded layer which is formed so that one side of the graded layer is lattice matched with the adjacent active region and the other side of the graded layer is lattice matched with an adjacent cladding region and the graded layer has a constituency which is graded from the one side to the other side of the graded layer, in order to compensate for the lattice mismatching between the active region and at least one or both of the cladding regions, wherein the active region is grown at a first temperature while supplying a first constituent to the substrate surface, one or both of the cladding regions is grown at a second temperature while supplying a second constituent to the substrate surface, and the graded layer is grown by supplying at least one of the first and second constituents to the substrate surface while the substrate temperature is changed between the first and second temperatures, and wherein the second temperature is greater than the first temperature, and the graded layer is grown, after the growth of the active region and before the growth of the second cladding region, by supplying at least one of the first and second constituents to the substrate surface while the substrate temperature is ramped upward.

2. A method according to claim 1, wherein the graded layer has a group III constituency which is graded across the graded layer.

3. A method according to claim 1, wherein the graded layer between the active region and at least one of the first and second cladding regions has a first constituent which is graded across the graded layer in a first direction and a second constituent which is graded across the graded layer in a second direction opposite to the first direction.

4. A method according to claim 1, wherein the first constituent is supplied to the substrate surface during growth of the graded layer but the supply of the second constituent to the substrate surface is stopped during growth of the graded layer.

5. A method according to claim 1, wherein both the group III constituent and the second constituent are supplied to the substrate surface during growth of the graded layer, and the second constituent is supplied to the substrate surface at a rate which is varied monotonically during growth of the graded layer between a maximum rate at which the second constituent is supplied during growth of at least one of the first and second cladding regions and a minimum rate.

6. A method according to claim 1, wherein at least one of the first and second cladding regions comprises a III-nitride semiconductor material which is lattice mismatched with a III-nitride semiconductor material of one of the first and second contact regions which is adjacent to at least one of the first and second cladding regions, the device further comprising a further graded layer interposed between at least one of the first and second cladding regions and one of the first and second contact regions which is adjacent to at least one of the first and second cladding regions, such that one side of the further graded layer is lattice matched with at least one of the first and second cladding regions which is adjacent to the further graded layer, and the other side of the further graded layer is lattice matched with the one of the first and second contact regions which is adjacent to the further graded layer; and the further graded layer has a constituency which is graded from the one side to the other side of the further graded layer.

7. A method according to claim 1, wherein the device is grown by metal organic chemical vapor deposition (MOCVD).

8. A method according to claim 1, wherein the device is grown by molecular beam epitaxy (MBE).

9. A method according to claim 2, wherein at least one of the first and second cladding regions comprises a III-nitride semiconductor material which is lattice mismatched with a III-nitride semiconductor material of one of the first and second contact regions which is adjacent to at least one of the first and second cladding regions, the device further comprising a further graded layer interposed between at least one of the fist and second cladding regions and one of the first and second contact regions which is adjacent to at least one of the first and second cladding regions, such that one side of the further graded layer is lattice matched with at least one of the first and second cladding regions which is adjacent to the further graded layers, and the other side of the further graded layer is lattice matched with the one of the first and second contact regions which is adjacent to the further graded layer; and the further graded layer has a constituency which is graded from the one side to the other side of the further graded layer.

10. A method according to claim 3, wherein at least one of the first and second cladding regions comprises a III-nitride semiconductor material which is lattice mismatched with a III-nitride semiconductor material of one of the first and second contact regions which is adjacent to at least one of the first and second cladding regions, the device further comprising a further graded layer interposed between at least one of the fist and second cladding regions and one of the first and second contact regions which is adjacent to at least one of the first and second cladding regions, such that one side of the further graded layer is lattice matched with at least one of the first and second cladding regions which is adjacent to the further graded layers, and the other side of the further graded layer is lattice matched with the one of the first and second contact regions which is adjacent to the further graded layer; and the further graded layer has a constituency which is graded from the one side to the other side of the further graded layer.

11. A method according to claim 4, wherein at least one of the first and second cladding regions comprises a III-nitride semiconductor material which is lattice mismatched with a III-nitride semiconductor material of one of the first and second contact regions which is adjacent to at least one of the first and second cladding regions, the device further comprising a further graded layer interposed between at least one of the fist and second cladding regions and one of the first and second contact regions which is adjacent to at least one of the first and second cladding regions, such that one side of the further graded layer is lattice matched with at least one of the first and second cladding regions which is adjacent to the further graded layers, and the other side of the further graded layer is lattice matched with the one of the first and second contact regions which is adjacent to the further graded layer; and the further graded layer has a constituency which is graded from the one side to the other side of the further graded layer.

12. A method according to claim 5, wherein at least one of the first and second cladding regions comprises a III-nitride semiconductor material which is lattice mismatched with a III-nitride semiconductor material of one of the first and second contact regions which is adjacent to at least one of the first and second cladding regions, the device further comprising a further graded layer interposed between at least one of the fist and second cladding regions and one of the first and second contact regions which is adjacent to at least one of the first and second cladding regions, such that one side of the further graded layer is lattice matched with at least one of the first and second cladding regions which is adjacent to the further graded layers, and the other side of the further graded layer is lattice matched with the one of the first and second contact regions which is adjacent to the further graded layer; and the further graded layer has a constituency which is graded from the one side to the other side of the further graded layer.

13. A method according to claim 2, wherein the device is grown by metal organic chemical vapor deposition (MOCVD).

14. A method according to claim 3, wherein the device is grown by metal organic chemical vapor deposition (MOCVD).

15. A method according to claim 4, wherein the device is grown by metal organic chemical vapor deposition (MOCVD).

16. A method according to claim 5, wherein the device is grown by metal organic chemical vapor deposition (MOCVD).

17. A method according to claim 6, wherein the device is grown by metal organic chemical vapor deposition (MOCVD).

18. A method according to claim 2, wherein the device is grown by molecular beam epitaxy (MBE).

19. A method according to claim 3, wherein the device is grown by molecular beam epitaxy (MBE).

20. A method according to claim 4, wherein the device is grown by molecular beam epitaxy (MBE).

21. A method according to claim 5, wherein the device is grown by molecular beam epitaxy (MBE).

22. A method according to claim 6, wherein the device is grown by molecular beam epitaxy (MBE).

23. A method of growing a III-nitride optoelectronic semiconductor device comprising the steps of successively growing on a substrate:
   a first cladding region formed of a III-nitride semiconductor material;
   an active region formed of III-nitride semiconductor material including at least In; and
   a second cladding region formed of III-nitride semiconductor material,
   wherein a first graded layer is grown so as to be disposed between the active region and at least one of the first and second cladding regions, the first graded layer including at least one constituency which is graded from one side to the other side of the first graded layer,
   wherein the active region is grown at a first temperature during the supplying of the first constituency, at least one of the first and second cladding regions are grown at a second temperature during the supplying of the second constituency, and when the graded layer is formed, the temperature of the substrate is graded between the first and second temperatures and at least one of the first or second constituencies is supplied, and
   wherein the second temperature is higher than the first temperature, and at least one of the first or second constituencies is supplied during the time when the substrate is subjected to an increase in temperature, such time being after the growth of the active region, during the growth of one of the graded layers and before the growth of the second cladding region.

24. A method of growing a III-nitride optoelectronic semiconductor device according to claim 23 further comprising a second graded layer, wherein one of the first graded layer or the second graded layer includes at least one Group III constituency where the at least one constituency is continuously graded in a direction of the thickness of the first graded layer or the second graded layer.

25. A method of growing a III-nitride optoelectronic semiconductor device according to claim 23 further comprising a second graded layer, wherein one of the first graded layer or the second graded layer includes a first constituency which is graded in a first direction, and a second constituency which is graded in a second direction opposite to the first direction.

26. A method of growing a III-nitride optoelectronic semiconductor device according to claim 23, wherein the device is grown by metal organic chemical vapor deposition (MOCVD).

27. A method of growing a III-nitride optoelectronic semiconductor device according to claim 23, wherein the device is grown by molecular beam epitaxy (MBE).

28. A method of growing a III-nitride optoelectronic semiconductor device according to claim 23, wherein the first constituency is In.

29. A method of growing a III-nitride optoelectronic semiconductor device according to claim 23, wherein the second constituency is Al.

30. A method of growing a III-nitride optoelectronic semiconductor device comprising the steps of successively growing on a substrate:
   a first cladding region, the first cladding region being formed of a III-nitride semiconductor material;
   an active region, the active region including a quantum well and being bound on either side by a guide region the quantum well being formed of a III-nitride semiconductor material including at least In; and
   a second cladding region, the second cladding region being formed of a III-nitride semiconductor material,
   wherein a first graded layer is grown so as to be disposed between at least one of the guide regions and the cladding layer which is adjacent to the at least one guide region, the first graded layer including at least one constituency which is graded from one side to the other side of the first graded layer,
   wherein the active region is grown at a first temperature during the supplying of the first constituency, at least one of the first and second cladding regions are grown at a second temperature during the supplying of the second constituency, and when the graded layer is formed, the temperature of the substrate is graded between the first and second temperatures and at least one of the first or second constituencies is supplied,
   wherein the second temperature is higher than the first temperature, and at least one of the first or second constituencies is supplied during the time when the substrate is subjected to an increase in temperature, such time being after the growth of the active region, during the growth of one of the graded layers and before the growth of the second cladding region.

31. A method of growing a III-nitride optoelectronic semiconductor device according to claim 30 further comprising a second graded layer, wherein one of the first graded layer or the second graded layer includes at least one Group III constituency where the at least one constituency is continuously graded in a direction of the thickness of the first graded layer or the second graded layer.

32. A method of growing a III-nitride optoelectronic semiconductor device according to claim 30 further comprising a second graded layer, wherein one of the first graded layer or the second graded layer includes a first constituency which is graded in a first direction, and a second constituency which is graded in a second direction opposite to the first direction.

33. A method of growing a III-nitride optoelectronic semiconductor device according to claim 30, wherein the device is grown by metal organic chemical vapor deposition (MOCVD).

34. A method of growing a III-nitride optoelectronic semiconductor device according to claim 30, wherein the device is grown by molecular beam epitaxy (MBE).

35. A method of growing a III-nitride optoelectronic semiconductor device according to claim 30, wherein the first constituency is In.

36. A method of growing a III-nitride optoelectronic semiconductor device according to claim 30, wherein the second constituency is Al.

37. A method of growing a III-nitride optoelectronic semiconductor device comprising the steps of successively growing on a substrate:

a first cladding region, the first cladding region being formed of a III-nitride semiconductor material;

an active region, the active region including a quantum well and being bound on either side by a guide region the quantum well being formed of a III-nitride semiconductor material including at least In; and a second cladding region, the second cladding region being formed of a III-nitride semiconductor material, wherein a first graded layer is grown so as to be disposed between at least one of the guide regions and the quantum well of the active region, the first graded layer including at least one constituency which is graded from one side to the other side of the first graded layer, wherein the active region is grown at a first temperature during the supplying of the first constituency, at least one of the first and second cladding regions are grown at a second temperature during the supplying of the second constituency, and when the graded layer is formed, the temperature of the substrate is graded between the first and second temperatures and at least one of the first or second constituencies is supplied, and wherein the second temperature is higher than the first temperature, and at least one of the first or second constituencies is supplied during the time when the substrate is subjected to an increase in temperature, such time being after the growth of the active region, during the growth of one of the graded layers and before the growth of the second cladding region.

38. A method of growing a III-nitride optoelectronic semiconductor device according to claim 37 further comprising a second graded layer, wherein one of the first graded layer or the second graded layer includes at least one Group III constituency where the at least one constituency is continuously graded in a direction of the thickness of the first graded layer or the second graded layer.

39. A method of growing a III-nitride optoelectronic semiconductor device according to claim 37 further comprising a second graded layer, wherein one of the first graded layer or the second graded layer includes a first constituency which is graded in a first direction, and a second constituency which is graded in a second direction opposite to the first direction.

40. A method of growing a III-nitride optoelectronic semiconductor device according to claim 37, wherein the device is grown by metal organic chemical vapor deposition (MOCVD).

41. A method of growing a III-nitride optoelectronic semiconductor device according to claim 37, wherein the device is grown by molecular beam epitaxy (MBE).

42. A method of growing a III-nitride optoelectronic semiconductor device according to claim 37, wherein the first constituency is In.

43. A method of growing a III-nitride optoelectronic semiconductor device according to claim 37, wherein the second constituency is Al.

* * * * *